(12) United States Patent  
Yamashita

(10) Patent No.: US 8,902,347 B2  
(45) Date of Patent: Dec. 2, 2014

(54) SOLID-STATE IMAGE SENSING DEVICE AND ELECTRONIC APPARATUS

(75) Inventor: Kazuyoshi Yamashita, Kanagawa (JP)

(73) Assignee: Sony Corporation (JP)

( * ) Notice: Subject to any disclaimer, the term of this patent is extended or adjusted under 35 U.S.C. 154(b) by 121 days.

(21) Appl. No.: 13/587,324

(22) Filed: Aug. 16, 2012

(65) Prior Publication Data

US 2013/0050548 A1 Feb. 28, 2013

(30) Foreign Application Priority Data

Aug. 26, 2011 (JP) ................................ 2011-184762

(51) Int. Cl.
*H04N 5/225* (2006.01)
*H04N 5/335* (2011.01)
*H01L 27/146* (2006.01)

(52) U.S. Cl.
CPC .... *H01L 27/14621* (2013.01); *H01L 27/14625* (2013.01); *H01L 27/1464* (2013.01); *H01L 27/14623* (2013.01)
USPC .......................................... 348/340; 348/294

(58) Field of Classification Search
CPC . H04N 5/2254; H04N 5/2253; H04N 5/2257; H04N 5/335; H04N 5/378; H04N 3/155; H04N 9/045; H01L 27/14627; H01L 27/14625; H01L 27/14643
USPC ................................................. 348/340, 294
See application file for complete search history.

(56) References Cited

U.S. PATENT DOCUMENTS 5,587,820 A * 12/1996 May et al. ..................... 349/116
7,106,377 B2 * 9/2006 Bean et al. .................... 348/364

FOREIGN PATENT DOCUMENTS

JP 2004-014802 1/2004

* cited by examiner

*Primary Examiner* — Twyler Haskins
*Assistant Examiner* — Quang Le
(74) *Attorney, Agent, or Firm* — Sheridan Ross P.C.

(57) ABSTRACT

A solid-state image sensing device includes a light receiving layer and a shutter layer. The light receiving layer has a photoelectric conversion part arranged in a plane state and configured to convert received light into an electric signal. The shutter layer is configured to control transmission of the light to be incident on the light receiving layer. In the solid-state image sensing device, an interval between the light receiving layer and the shutter layer is less than or equal to a length of a shutter element formed in the shutter layer.

11 Claims, 16 Drawing Sheets

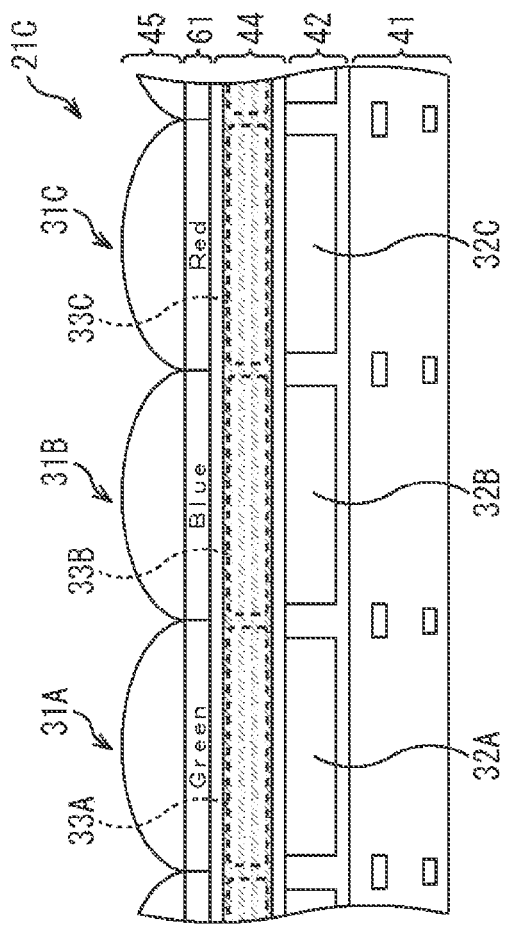
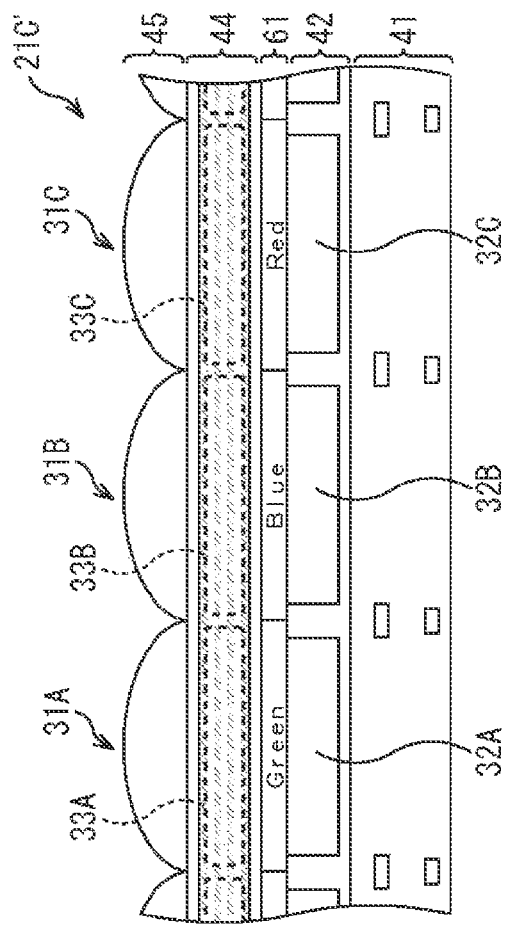

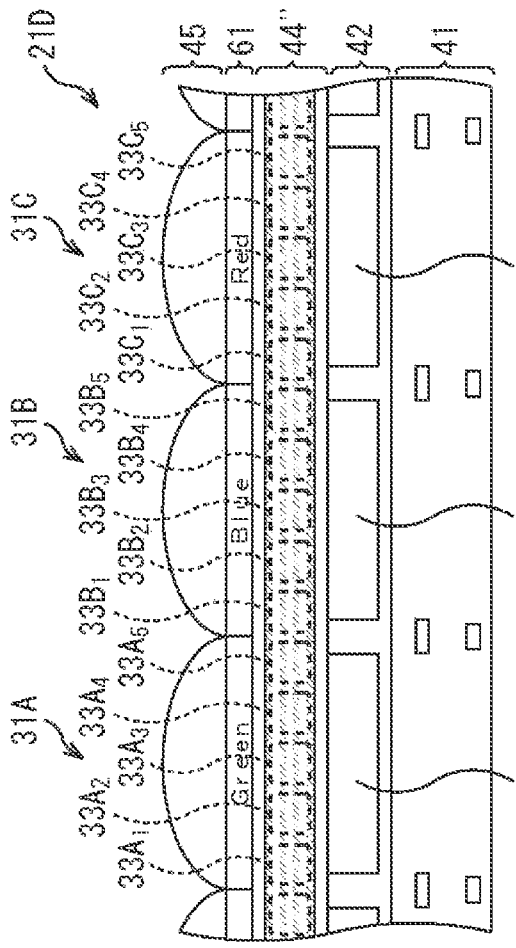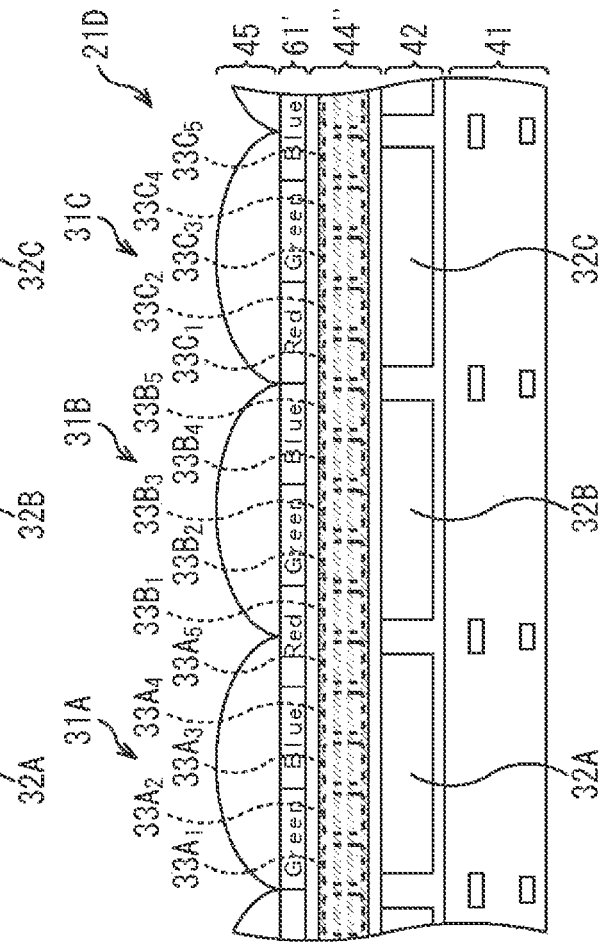

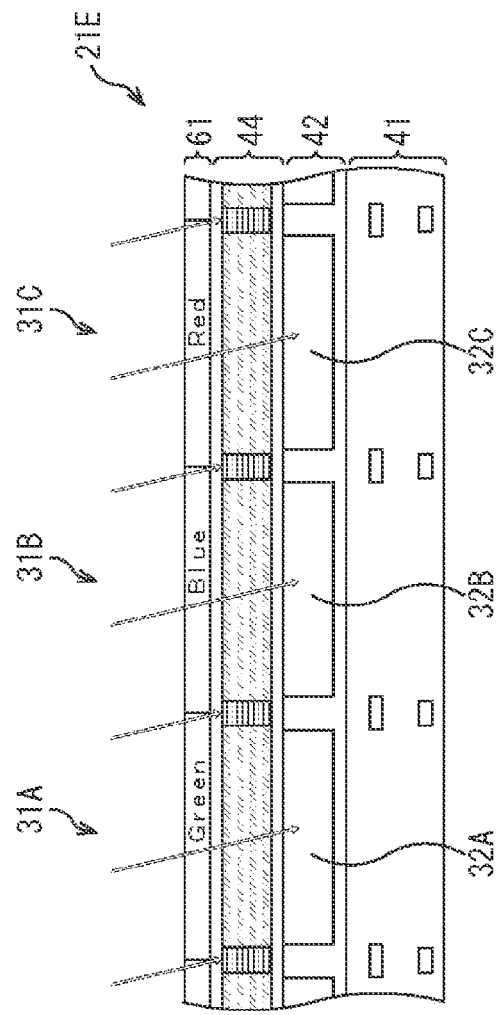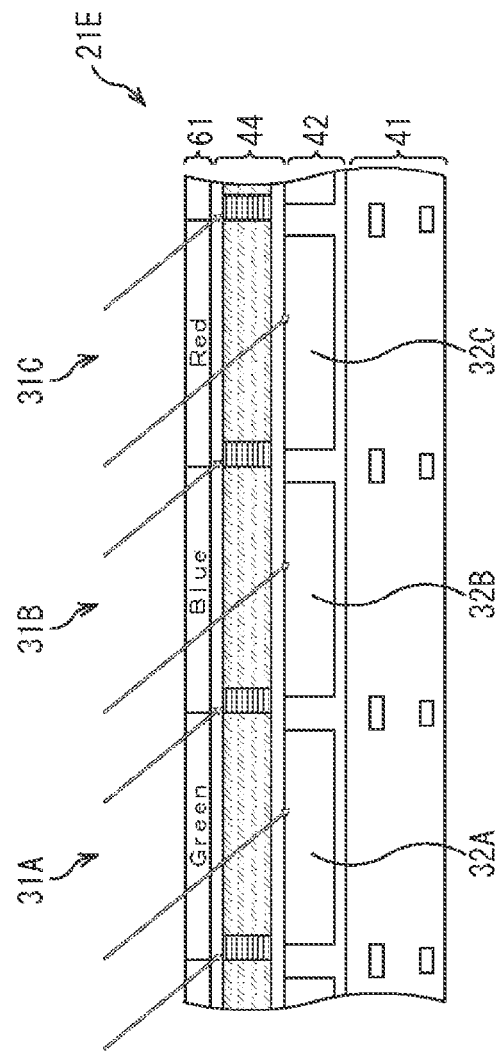
FIG. 13A
FIG. 13B

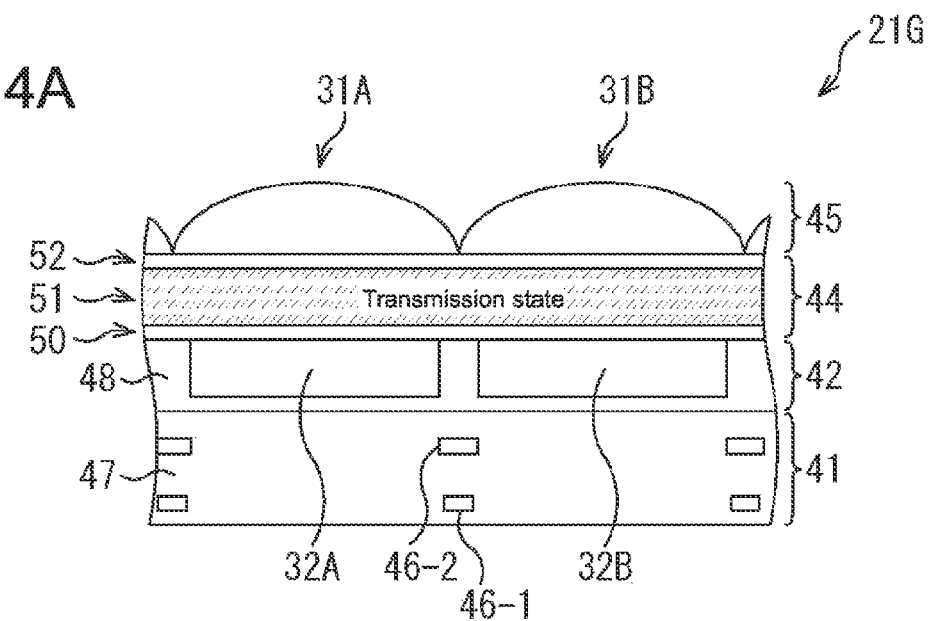
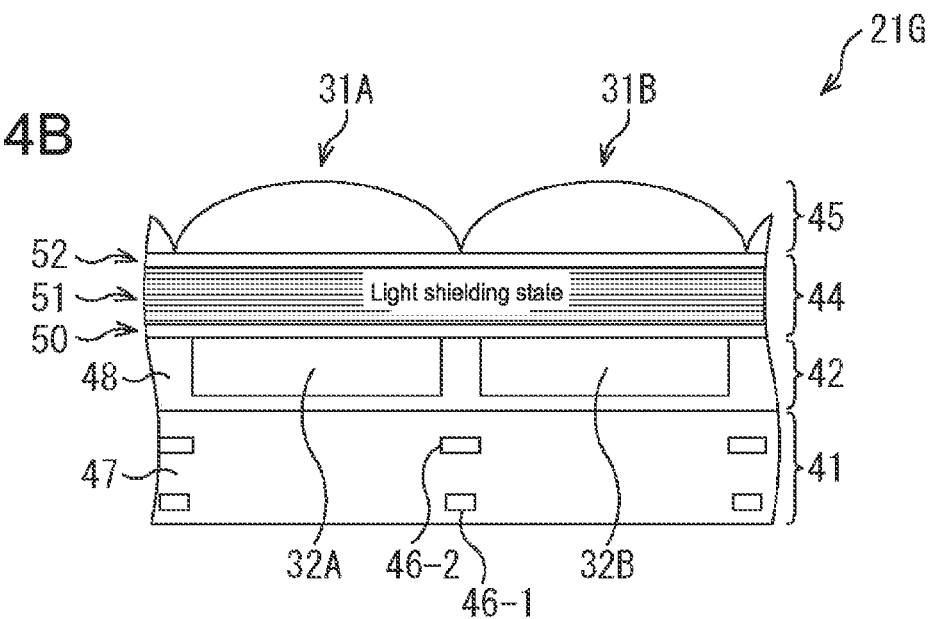

SOLID-STATE IMAGE SENSING DEVICE AND ELECTRONIC APPARATUS

BACKGROUND

The present disclosure relates to a solid-state image sensing device and an electronic apparatus, and in particular, to a solid-state image sensing device and an electronic apparatus that are capable of preventing a reduction in image quality.

In general, solid-state image sensing devices such as CMOS (Complementary Metal Oxide Semiconductor) image sensors and CCD (Charge Coupled Device) image sensors have been widely used in digital still cameras, digital video cameras, or the like.

For example, incident light incident on a CMOS image sensor is photoelectrically converted by PDs (Photodiodes) serving as photoelectric conversion parts of pixels. Then, charges generated by the PDs are transferred to a FD (Floating Diffusion) serving as a floating diffusion area via a transfer transistor, and an amplification transistor outputs a pixel signal at a level corresponding to the charges accumulated in the FD.

In recent years, various developments have been made for downsizing solid-state image sensing devices and improving the resolution of the same. For example, the present applicant has developed a solid-state image sensing device capable of controlling the transmission of light incident on each pixel on a pixel-by-pixel basis (see, for example, Japanese Patent Laid-open No. 2004-14802).

With reference to FIG. 1, a solid-state image sensing device capable of controlling the transmission of light on a pixel-by-pixel basis will be described.

The solid-state image sensing device 11 shown in FIG. 1 has a semiconductor substrate 12, a wiring layer 13, a shutter layer 14, and an OCL (On-Chip Lens) layer 15 successively laminated to each other from the side of its lower layer. In the solid-state image sensing device 11, a plurality of PDs (photodiodes) 16 are formed in the semiconductor substrate 12, and wiring 17 is formed in the wiring layer 13. In FIG. 1, a cross section near two adjacent PDs 16A and 16B is shown, and the wiring layer 13 has a two-layer structure made of a layer where the wiring 17-1 is disposed and a layer where the wiring 17-2 is disposed.

Further, in the solid-state image sensing device 11, the shutter layer 14 controls the transmission of light for each of pixels having the respective PDs 16. In the example of FIG. 1, the shutter layer 14 corresponding to the PD 16A is brought into a light shielding state, while the shutter layer 14 corresponding to the PD 16B is brought into a transmission state.

Meanwhile, when light is incident on the solid-state image sensing device 11 from an oblique direction, there is a likelihood of the light entering from the adjacent pixels via the wiring layer 13. That is, the arrangement of the wiring layer 13 having a thickness greater than or equal to a predetermined thickness between the semiconductor substrate 12 and the shutter layer 14 causes the light from the oblique direction to be incident on the adjacent pixels directly or after being reflected by the wiring 17-1 and 17-2. For example, as shown in FIG. 1, the light transmitted through the shutter layer 14 corresponding the PD 16B may be received by the PD 16A.

SUMMARY

As described above, in the solid-state image sensing device in the related art capable of controlling the transmission of light on a pixel-by-pixel basis, there is a likelihood of the light entering into the adjacent pixels. As a result, color mixture is caused to reduce image quality. Accordingly, it is requested to prevent the occurrence of color mixture and a reduction in image quality.

The present disclosure has been made in view of the above circumstances, and it is therefore desirable to prevent a reduction in image quality.

According to an embodiment of the present disclosure, there is provided a solid-state image sensing device including a light receiving layer and a shutter layer. The light receiving layer has a photoelectric conversion part arranged in a plane state and configured to convert received light into an electric signal. The shutter layer is configured to control transmission of the light to be incident on the light receiving layer. In the solid-state image sensing device, an interval between the light receiving layer and the shutter layer is less than or equal to a length of a shutter element formed in the shutter layer.

According to another embodiment of the present disclosure, there is provided an electronic apparatus including a solid-state image sensing device. The solid-state image sensing device has a light receiving layer and a shutter layer. The light receiving layer has a photoelectric conversion part arranged in a plane state and configured to convert received light into an electric signal. The shutter layer is configured to control transmission of the light to be incident on the light receiving layer. In the solid-state image sensing device, an interval between the light receiving layer and the shutter layer is less than or equal to a length of a shutter element formed in the shutter layer.

In an embodiment of the present disclosure, an interval between a light receiving layer having a photoelectric conversion part arranged in a plane state and configured to convert received light into an electric signal and a shutter layer configured to control transmission of the light to be incident on the light receiving layer is set to be less than or equal to a length of a shutter element formed in the shutter layer.

According to an embodiment of the present disclosure, it is possible to prevent a reduction in image quality.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 9A and 9B are cross-sectional views showing a fourth configuration example of the solid-state image sensing device;

FIGS. 10A and 10B are cross-sectional views showing a fifth configuration example of the solid-state image sensing device;

FIGS. 13A and 13B are views for explaining the adjustment of a shutter layer according to the incident angle of light;

FIGS. 14A and 14B are cross-sectional views showing a seventh configuration example of the solid-state image sensing device;

DETAILED DESCRIPTION OF EMBODIMENT

Hereinafter, a specific embodiment to which the present disclosure is applied will be described in detail with reference to the drawings.

Figure 2:
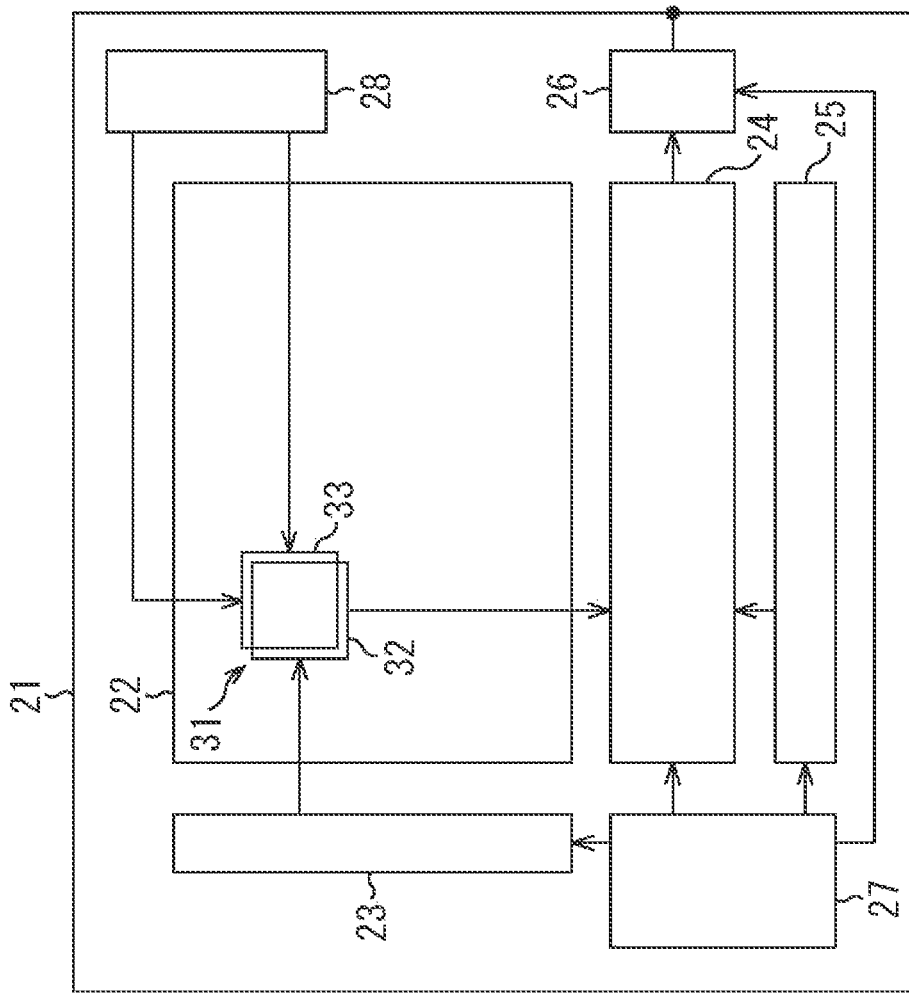
FIG. 2 is a block diagram showing a configuration example according to an embodiment of a solid-state image sensing device to which the present disclosure is applied.

FIG. 2 is a block diagram showing a configuration example according to an embodiment of a solid-state image sensing device to which the present disclosure is applied.

In FIG. 2, the solid-state image sensing device 21 has a pixel part 22, a vertical driving part 23, a column processing part 24, a horizontal driving part 25, an output part 26, a drive controlling part 27, and a shutter driving part 28.

The pixel part 22 has a plurality of pixels 31 arranged in array form. The pixels 31 are connected to the vertical driving part 23 via a plurality of horizontal signal lines corresponding to the number of the rows of the pixels 31 and connected to the column processing part 24 via a plurality of vertical signal lines corresponding to the number of the columns of the pixels 31. In other words, a plurality of pixels 31 of the pixel part 22 are arranged at the points where the horizontal signal lines and the vertical signal lines intersect each other. According to a driving signal supplied from the vertical driving part 23, the pixel part 22 outputs a pixel signal at a level corresponding to charges generated by photoelectric conversion to the column processing part 24.

Further, the pixels 31 of the pixel part 22 have respective PDs (Photodiodes) 32 serving as photoelectric conversion parts and respective shutter elements 33 laminated on the side of the light receiving surfaces of the PDs 32. The shutter elements 33 control the transmission of incident light with respect to the PDs 32 according to the control of the shutter driving part 28. As the shutter elements 33, active matrix type liquid crystal shutters used in a display apparatus as disclosed in Japanese Patent Laid-open No. 2007-188047 filed by the present applicant are available. Note that MEMS (Micro Electro Mechanical Systems) elements and other elements may also be employed as the shutter elements 33.

The vertical driving part 23 successively supplies, via corresponding one of the horizontal signal lines, a driving signal (such as a transfer signal, a selection signal, and a resetting signal) for driving each of the pixels 31 for each of the rows of the plurality of pixels 31 of the pixel part 22.

The column processing part 24 applies, via corresponding one of the vertical signal lines, CDS (Correlated Double Sampling) processing to the pixel signal output from each of the pixels 31 to extract the signal level of the pixel signal, and acquires pixel data corresponding to a light receiving amount of each of the pixels 31.

The horizontal driving part 25 successively supplies, to the column processing part 24, a driving signal for outputting the pixel data acquired from each of the pixels 31 from the column processing part 24 for each of the columns of the plurality of pixels 31 of the pixel part 22.

The output part 26 receives the pixel data from the column processing part 24 at a timing based on the driving signal of the horizontal driving part 25. For example, the output part 26 amplifies the pixel data and outputs the resulting pixel data to a subsequent-stage image processing circuit.

The drive controlling part 27 controls the driving of each of the blocks inside the solid-state image sensing device 21. For example, the drive controlling part 27 generates a clock signal according to a driving cycle of each of the blocks and supplies the resulting clock signal to each of the blocks.

The shutter driving part 28 controls the switching between the transmission state and the light shielding state of the shutter elements 33.

Figure 3:
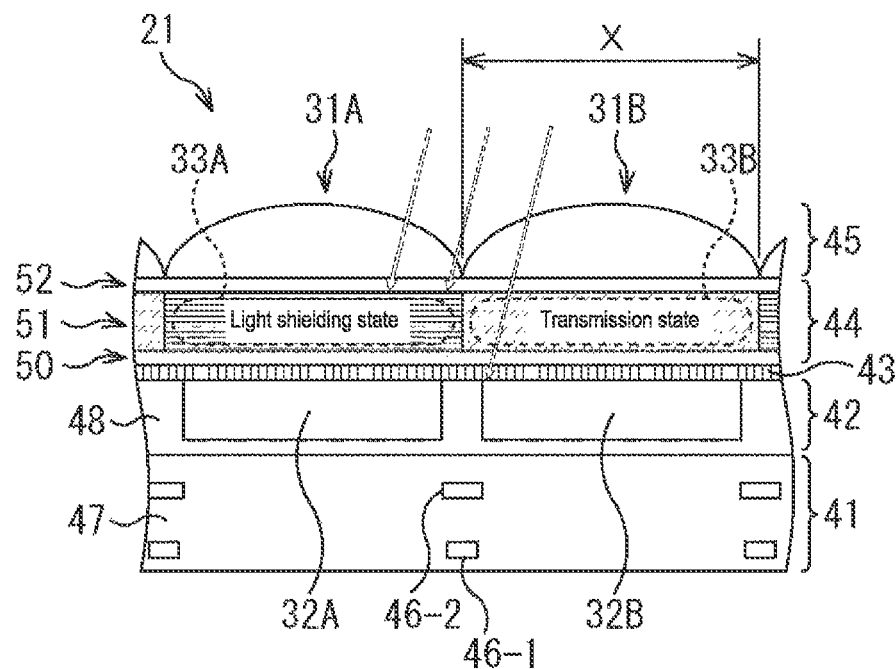
FIG. 3 is a cross-sectional view showing a first configuration example of the solid-state image sensing device.

FIG. 3 is a cross-sectional view showing a first configuration example of the solid-state image sensing device 21. FIG. 3 shows a cross section near two adjacent pixels 31A and 31B among the plurality of pixels 31 arranged in array form.

As shown in FIG. 3, the solid-state image sensing device 21 has a wiring layer 41, a semiconductor substrate 42, an insulation film 43, a shutter layer 44, and an OCL (On-Chip Lens) layer 45 successively laminated to each other from the side of its lower layer. Note that the solid-state image sensing device 21 is so-called a backside illumination type CMOS image sensor where incident light is irradiated onto a back surface (surface facing an upper side in FIG. 3) opposite to the front surface of the semiconductor substrate 42 where the wiring layer 41 is provided.

The wiring layer 41 is supported by, for example, a substrate supporting member (not shown) arranged below the wiring layer 41, and has wiring 46 embedded in an interlayer insulation film 47 to perform the reading of the charges of the PDs (photodiodes) 32 formed in the semiconductor substrate 42, or the like. Further, the wiring layer 41 may employ such a structure as to form a plurality of layers with the wiring 46. In the example of FIG. 3, the wiring layer 41 has a two-layer structure made of a layer where wiring 46-1 is disposed and a layer where wiring 46-2 is disposed.

For example, in the semiconductor substrate 42, the PDs 32 each formed inside a P-type silicon layer (P-well) 48 and made of an N region are formed to come in contact with the side of the back surface (upper side in FIG. 3) of the semiconductor substrate 42. The PDs 32 convert received light into an electric signal. The semiconductor substrate 42 has the plurality of PDs 32 arranged in a plane state and serves as a light receiving layer that receives light.

The insulation film 43 is made of a transparent insulation material and insulates the semiconductor substrate 42 from the shutter layer 44.

In the shutter layer 44, a liquid crystal layer 51 is sandwiched between a counter electrode 50 and a driving panel 52, and the counter electrode 50 is laminated toward the side of the semiconductor substrate 42. Further, in the shutter layer 44, the driving panel 52 has an independent electrode for, for example, each of the pixels 31 to form the shutter element 33 capable of controlling the transmission of incident light for each of the pixels 31. In other words, one shutter element 33 is arranged with respect to one PD 32. Then, for example, when the shutter driving part 28 shown in FIG. 2 applies a voltage to the electrodes of the driving panel 52, the shutter elements 33 are brought into the light shielding state. In the example of FIG. 3, the shutter element 33A of the pixel 31A is brought into the light shielding state, while the shutter element 33B of the pixel 31B is brought into the transmission state.

In the OCL layer 45, small lenses for condensing incident light onto the PDs 32 are arranged in array form for the respective pixels 31. Note that each of the following configuration examples may or may not have the OCL layer 45.

In the solid-state image sensing device 21 thus configured, the transmission state and the light shielding state of the shutter elements 33 in the shutter layer 44 are switched according to the control of the shutter driving part 28. As a result, the solid-state image sensing device 21 is allowed to control the irradiation of light for each of the PDs 32.

Moreover, in the solid-state image sensing device 21, the wiring layer 41 is arranged on the side opposite to the surface of the semiconductor substrate 42 where light is incident. In other words, the wiring layer 41 is not arranged between the semiconductor substrate 42 and the shutter layer 44. With this configuration, the interval between the semiconductor substrate 42 and the shutter layer 44 of the solid-state image sensing device 21 may be made less than that of a solid-state image sensing device in the related art. As a result, the solid-state image sensing device 21 is allowed to prevent the entering of light from the adjacent pixels 31.

For example, in the solid-state image sensing device 11 described above with reference to FIG. 1, the wiring layer 13 is arranged between the semiconductor substrate 12 and the shutter layer 14. Therefore, there is a likelihood of light entering from the adjacent pixels via the wiring layer 13. On the other hand, in the solid-state image sensing device 21, the interval between the semiconductor substrate 42 and the shutter layer 44 is made less than or equal to a predetermined length. Therefore, the entering of light as seen in the solid-state image sensing device in the related art may be prevented. Thus, the solid-state image sensing device 21 is allowed to prevent a reduction in image quality due to the occurrence of color mixture and further increase the image quality than the solid-state image sensing device in the related art.

Here, the predetermined interval between the semiconductor substrate 42 and the shutter layer 44 is set to be less than or equal to, for example, a length X of the shutter elements 33 formed in the shutter layer 44. As a result, the solid-state image sensing device 21 is allowed to prevent the entering of light from the adjacent pixels. That is, in a case where the interval between the semiconductor substrate 42 and the shutter layer 44, i.e., the interval between the upper surface of the semiconductor substrate 42 and the lower surface of the shutter layer 44 (thickness of the insulation film 43 in the configuration of FIG. 3) is greater than the length X of the shutter elements 33 in the plane direction thereof, it is assumed that light shielding performance with respect to oblique light is degraded in principle (color mixture or the like occurs). On the other hand, in a case where the interval between the semiconductor substrate 42 and the shutter layer 44 is set to be less than or equal to the length X of the shutter elements 33 in the plane direction thereof, a light shielding effect for each of the pixels 31 may be reliably obtained with the arrangement of the shutter layer 44. Note that the predetermined interval is more desirably set to be zero. That is, the semiconductor substrate 42 may come in contact with the shutter layer 44.

Here, in the configuration example of the solid-state image sensing device 21 shown in FIG. 3, one shutter element 33 is arranged with respect to one PD 32. Therefore, the length X of the shutter elements 33 in the plane direction thereof is equivalent to the size of the PDs 32 in the plane direction thereof. On the other hand, in a case where a plurality of shutter elements 33 are arranged with respect to one PD 32 as will be described below, the interval between the semiconductor substrate 42 and the shutter layer 44 is made less than or equal to the length of each of the shutter elements 33, i.e., it is made greatly less than the size of the PDs 32.

Note that even in a case where a wiring layer is arranged between the semiconductor substrate 42 and the shutter layer 44, it is desirable that the thickness of the wiring layer be made less than or equal to the length of the shutter elements 33 and that wiring disposed in the wiring layer be made of one or less layer.

Figure 1:
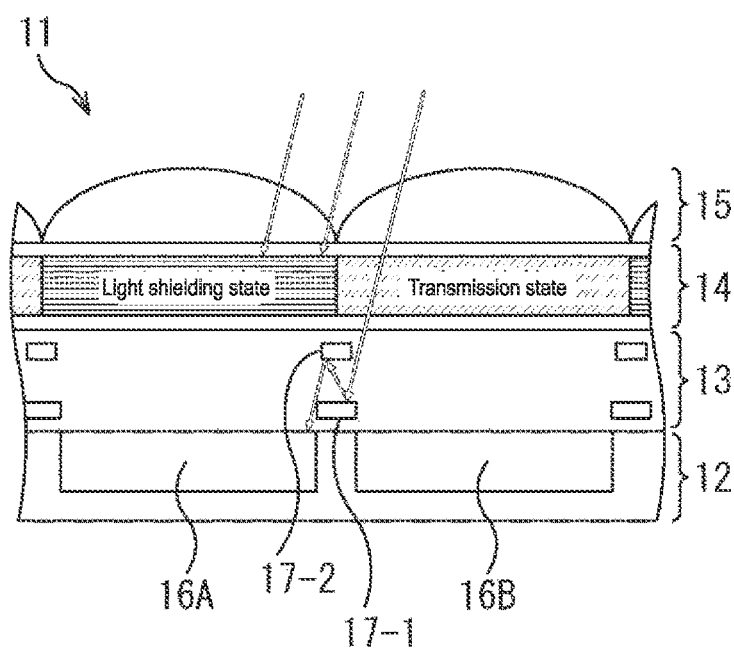
FIG. 1 is a cross-sectional view of a solid-state image sensing device in the related art capable of controlling the transmission of light on a pixel-by-pixel basis.

Further, even in a case where the wiring layer 13 is arranged between the semiconductor substrate 12 and the shutter layer 14 as in the solid-state image sensing device 11 shown in FIG. 1, it is assumed that color mixture may be prevented with an increase in the light shielding area between the pixels. However, the increase in the light shielding area between the pixels results in a reduction in an amount of light to be incident on the PDs 16. Thus, the sensitivity of the solid-state image sensing device 11 is reduced. On the other hand, it is not necessary for the solid-state image sensing device 21 to increase the light shielding area between the pixels. As a result, the solid-state image sensing device 21 is allowed to prevent the reduction of its sensitivity.

Moreover, in the solid-state image sensing device 11 shown in FIG. 1, the arrangement of the wiring layer 13 on the side of the PDs 16 where light is incident reduces the sensitivity of the solid-state image sensing device 11 and the S/N (Signal-to-Noise) ratio thereof as the pixels become finer. On the other hand, in the solid-state image sensing device 21, the wiring layer 41 is arranged on the side opposite to the side of the PDs 32 where light is incident. Therefore, the solid-state image sensing device 21 is allowed to prevent a reduction in the S/N ratio thereof. Moreover, with an increase in the sensitivity, the solid-state image sensing device 21 is allowed to pick up clear images in dark scenes. In this regard also, the solid-state image sensing device 21 is allowed to further increase image quality than the solid-state image sensing device in the related art.

Further, the shutter elements 33 are allowed to adjust an amount of transmission light, besides switching between the transmission state and the light shielding state thereof. For example, even in a screen where smear occurs with the application of an intensive light source in a CCD solid-state image sensing device, the solid-state image sensing device 21 performs dimming (reduces an amount of transmission light) with the shutter elements 33 corresponding to a part of the intensive light source, thereby making it possible to prevent the occurrence of smear.

In addition, in a case where a dark portion and a bright portion exist together in a screen, the solid-state image sensing device 21 dims (properly adjusts an amount of transmission light) the pixels 31 corresponding to the bright portion with the shutter layer 44, thereby making it possible to reduce light to be incident on the semiconductor substrate 42. For example, in the case of picking up an image such as a night scene, i.e., when an image is picked up in a dark place, a sensor generally takes a long accumulation time. Therefore, if a bright portion such as an electric bulb and the moon exists in a screen, overexposure is caused with the saturation of the bright portion. On the other hand, the solid-state image sensing device 21 dims (intentionally darkens) such a bright portion in a screen with the shutter layer 44, thereby making it possible to prevent the saturation (overexposure) of the bright portion. That is, the solid-state image sensing device 21 is allowed to pick up a dark portion brightly, i.e., increase a dynamic range without causing the overexposure of a bright portion.

Further, in order to increase a dynamic range, the related art has employed a method of combining together a plurality of images each having a different accumulation time, for example. On the other hand, the solid-state image sensing device 21 is allowed to increase a dynamic range with one image and express an entire screen with abundant gradation.

Moreover, because the solid-state image sensing device 21 controls the transmission and non-transmission of light with the shutter layer 44, it is allowed to function as, for example, the mechanical shutter of an image sensing apparatus in the related art. This results in a contribution to the downsizing (elimination of the mechanical shutter) and the weight reduction of the image sensing apparatus.

Figure 4:
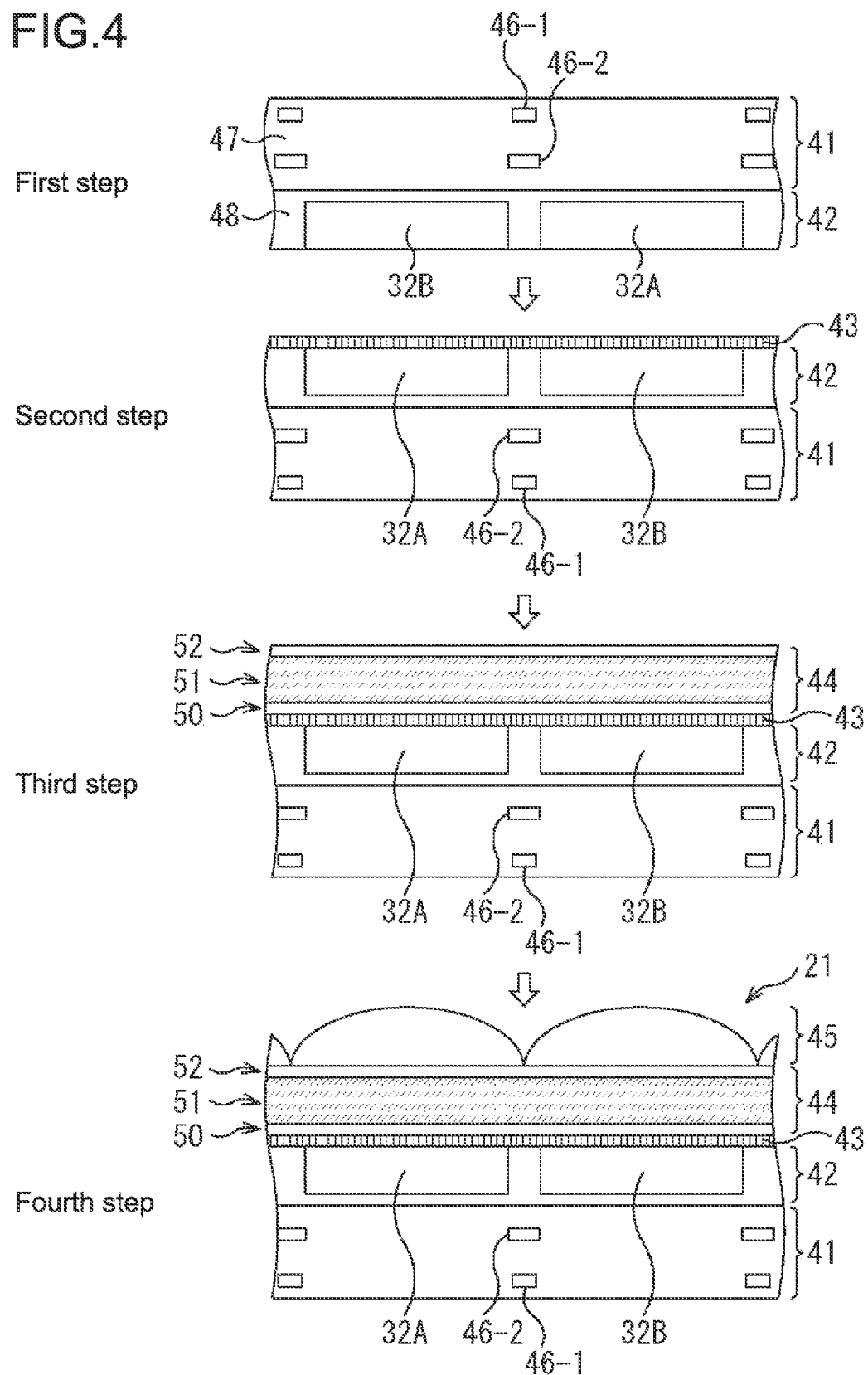
FIG. 4 is a view for explaining a method of manufacturing the solid-state image sensing device.

Next, a method of manufacturing the solid-state image sensing device 21 will be described with reference to FIG. 4.

In a first step, ion-implantation is performed from, for example, the side of the front surface of the semiconductor substrate 42. Thus, the PDs 32 are formed in the P-type silicon layer 48. Then, the wiring 46 is formed every time the interlayer insulation film 47 is laminated on the front surface of the semiconductor substrate 42 with a predetermined thickness. Thus, the wiring layer 41 is formed.

In a second step, with the side of the front surface, where the wiring layer 41 is laminated on the semiconductor substrate 42, directed downward, the insulation film 43 is laminated on the back surface of the semiconductor substrate 42.

In a third step, the counter electrode 50 is laminated on the insulation film 43, and the driving panel 52 is laminated so as to sandwich the liquid crystal layer 51. Thus, the shutter layer 44 is formed.

In a fourth step, the OCL layer 45 is laminated on the shutter layer 44. Through the steps described above, the solid-state image sensing device 21 is manufactured.

Figure 5:
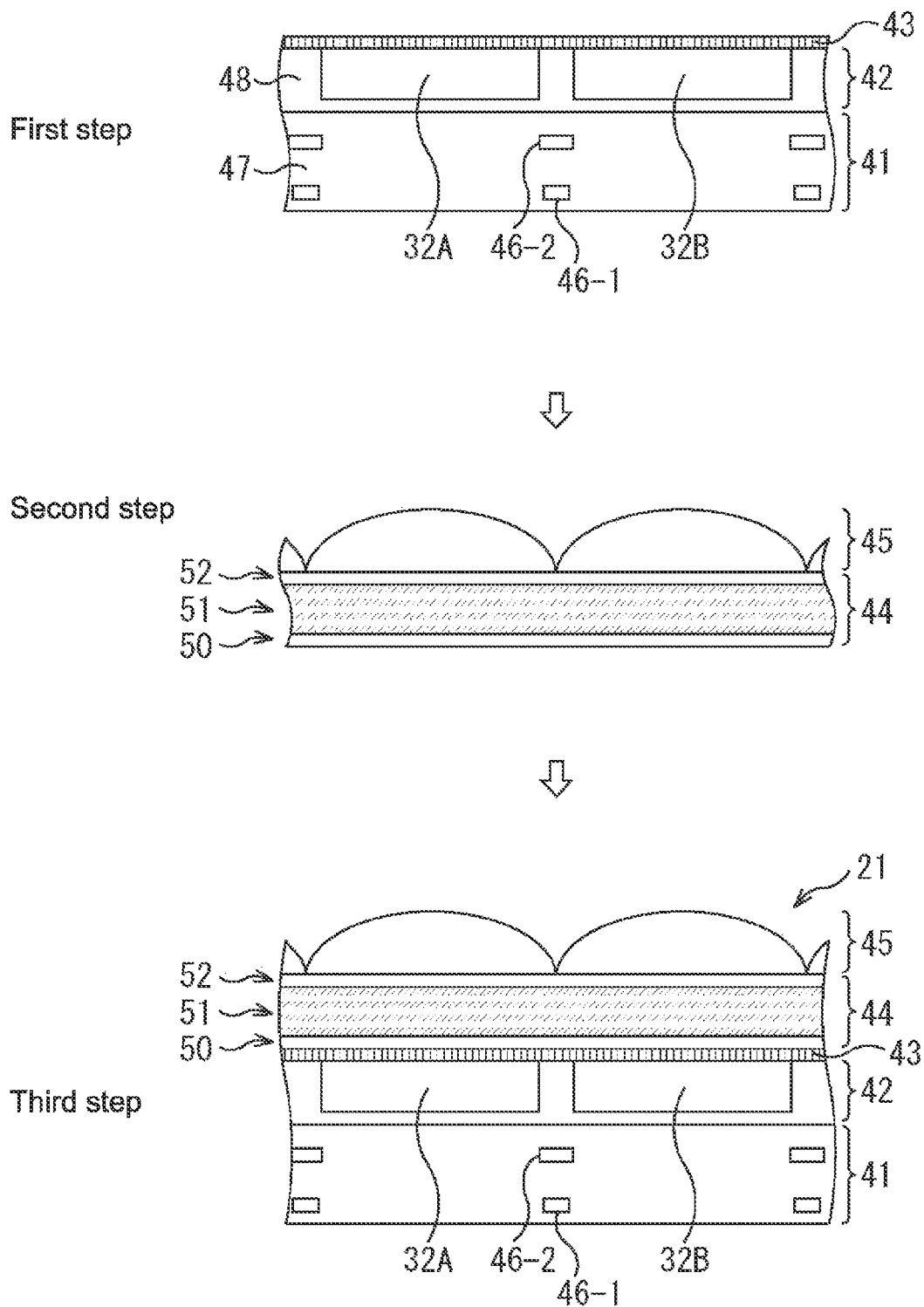
FIG. 5 is a view for explaining another method of manufacturing the solid-state image sensing device.

Next, another method of manufacturing the solid-state image sensing device 21 will be described with reference to FIG. 5.

In a first step, a structure where the wiring layer 41, the semiconductor substrate 42, and the insulation film 43 are laminated one on another is formed in the same manner as the first and second steps described above with reference to FIG. 4.

In a second step, a structure where the OCL layer 45 is laminated on the shutter layer 44 is formed. In the shutter layer 44, the counter electrode 50 and the driving panel 52 are formed so as to sandwich the liquid crystal layer 51 therebetween.

In a third step, the counter electrode 50 of the structure formed in the second step is bonded to the insulation film 43 of the structure formed in the first step. Through the steps described above, the solid-state image sensing device 21 is manufactured.

Next, a second configuration example of the solid-state image sensing device 21 will be described with reference to FIG. 6. Note that the same constituents as those of the solid-state image sensing device 21 shown in FIG. 3 will be denoted by the same symbols and detailed descriptions thereof will be omitted.

Figure 6:
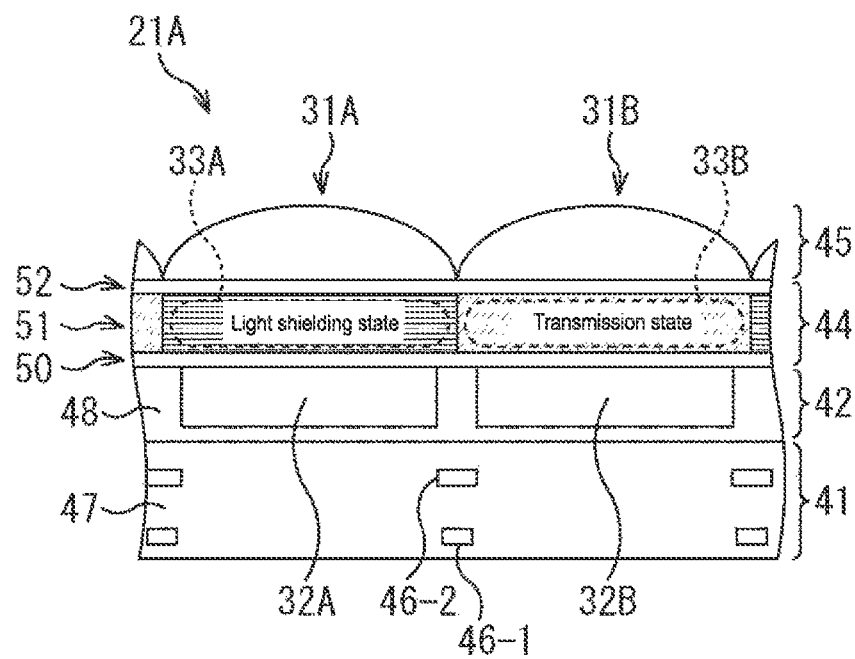
FIG. 6 is a cross-sectional view showing a second configuration example of the solid-state image sensing device.

As shown in FIG. 6, a solid-state image sensing device 21A has the wiring layer 41, the semiconductor substrate 42, the shutter layer 44, and the OCL layer 45 successively laminated to each other from its lower layer. That is, in the solid-state image sensing device 21 shown in FIG. 3, the shutter layer 44 is laminated on the semiconductor substrate 42 via the insulation film 43. On the other hand, in the solid-state image sensing device 21A, the shutter layer 44 is directly laminated on the semiconductor substrate 42.

In the solid-state image sensing device 21A thus configured, the PDs 32 of the semiconductor substrate 42 and the counter electrode 50 of the shutter layer 44 are electrically connected to each other. Accordingly, for example, with the application of a negative bias to the counter electrode 50, the solid-state image sensing device 21A may obtain a pinning effect, thereby making it possible to reduce the occurrence of, for example, white spots and a dark current.

Figure 7:
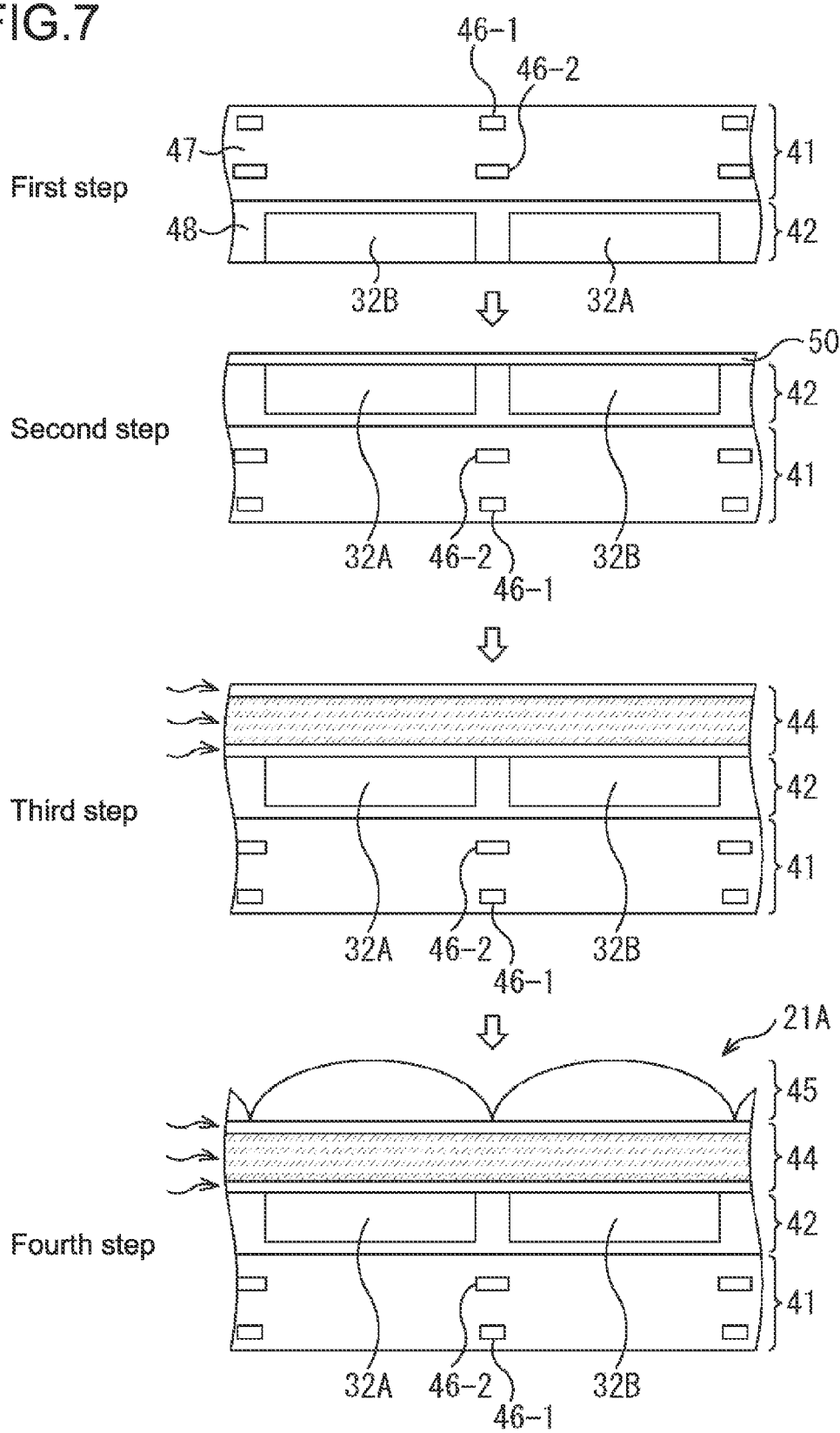
FIG. 7 is a view for explaining a method of manufacturing the solid-state image sensing device.

Next, a method of manufacturing the solid-state image sensing device 21A will be described with reference to FIG. 7.

In a first step, ion-implantation is performed from, for example, the side of the front surface of the semiconductor substrate 42. Thus, the PDs 32 are formed in the P-type silicon layer 48. Then, the wiring 46 is formed every time the interlayer insulation film 47 is laminated on the front surface of the semiconductor substrate 42 with a predetermined thickness. Thus, the wiring layer 41 is formed.

In a second step, with the side of the front surface, where the wiring layer 41 is laminated on the semiconductor substrate 42, directed downward, the counter electrode 50 is laminated on the back surface of the semiconductor substrate 42.

In a third step, the driving panel 52 is laminated on the counter electrode 50 so as to sandwich the liquid crystal layer 51. Thus, the shutter layer 44 is formed.

In a fourth step, the OCL layer 45 is laminated on the shutter layer 44. Through the steps described above, the solid-state image sensing device 21A is manufactured.

Next, a third configuration example of the solid-state image sensing device 21 will be described with reference to FIGS. 8A to 8C. Note that the same constituents as those of the solid-state image sensing device 21 shown in FIG. 3 will be denoted by the same symbols and detailed descriptions thereof will be omitted. Further, in FIGS. 8A to 8C, the OCL layer 45 is not shown.

Figure 8A:
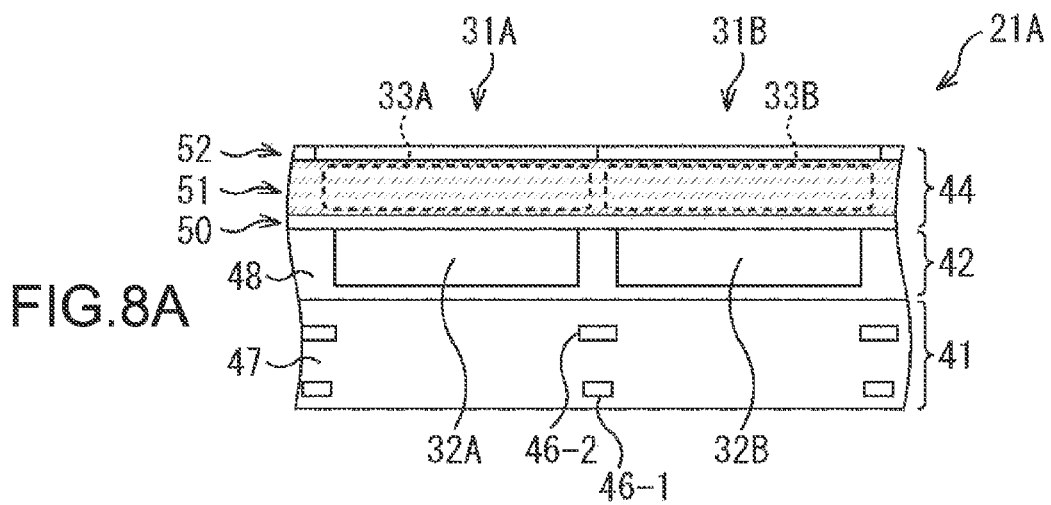
FIGS. 8A to 8C are cross-sectional views showing a third configuration example of the solid-state image sensing device.

FIG. 8A shows the solid-state image sensing device 21A as the second configuration example shown in FIG. 6. As described above, in the solid-state image sensing device 21A, one shutter element 33 is arranged with respect to one PD 32 for each of the pixels 31. That is, in the solid-state image sensing device 21A, the shutter element 33A is arranged with respect to the PD 32A in the pixel 31A, and the shutter element 33B is arranged with respect to the PD 32B in the pixel 31B. Further, in the solid-state image sensing device 21A, the shutter layer 44 is composed of the driving panel 52 formed to have one independent electrode for each of the pixels 31.

Figure 8B:
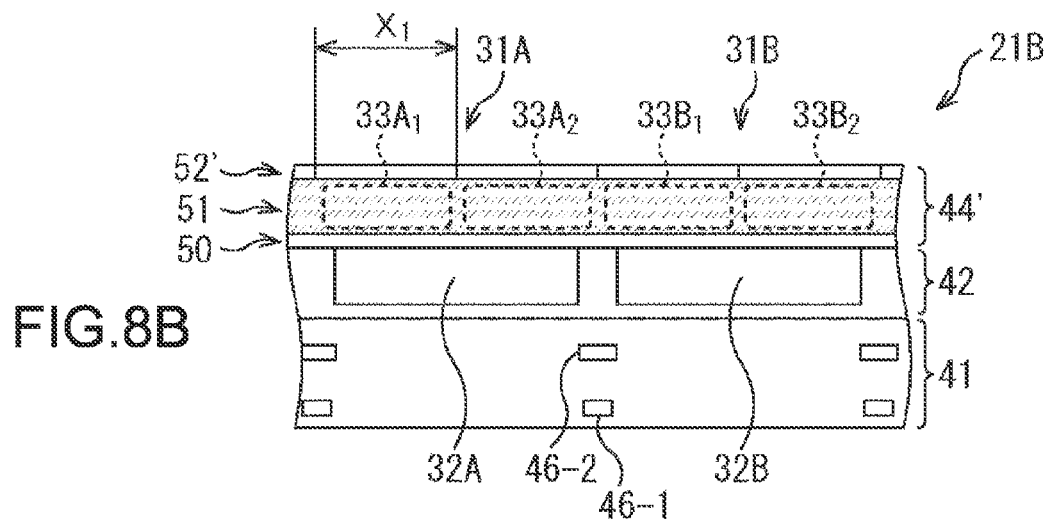

FIG. 8B shows a solid-state image sensing device 21B as a third configuration example. As shown in FIG. 8B, in the solid-state image sensing device 21B, two shutter elements 33 are arranged with respect to one PD 32 for each of the pixels 31. That is, in the solid-state image sensing device 21B, two shutter elements $33A_1$ and $33A_2$ are arranged with respect to the PD 32A in the pixel 31A, and two shutter elements $33B_1$ and $33B_2$ are arranged with respect to the PD 32B in the pixel 31B. Further, in the solid-state image sensing device 21B, a shutter layer 44' is composed of a driving panel 52' formed to have two independent electrodes for each of the pixels 31.

Figure 8C:
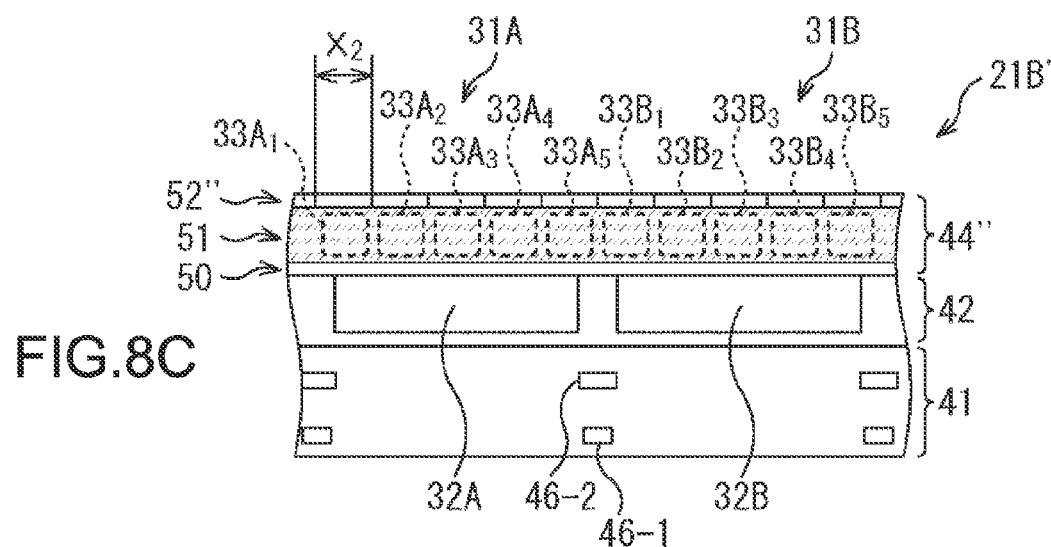

FIG. 8C shows a solid-state image sensing device 21B' as a modification of the third configuration example. As shown in FIG. 8C, in the solid-state image sensing device 21B', five shutter elements 33 are arranged with respect to one PD 32 for each of the pixels 31. That is, in the solid-state image sensing device 21B', five shutter elements $33A_1$ to $33A_5$ are arranged with respect to the PD 32A in the pixel 31A, and five shutter elements $33B_1$ to $33B_5$ are arranged with respect to the PD 32B in the pixel 31B. Further, in the solid-state image sensing device 21B', a shutter layer 44" is composed of a driving panel 52" formed to have five independent electrodes for each of the pixels 31.

As described above, in the solid-state image sensing device 21, the plurality of shutter elements 33 may be arranged with respect to one PD 32 for each of the pixels 31.

Note that even where the plurality of shutter elements 33 are arranged with respect to one PD 32, the interval between the semiconductor substrate 42 and the shutter layer 44 is set to be, as described above, less than or equal to the length of the shutter elements 33 in the plane direction thereof formed in the shutter layer 44. That is, in the solid-state image sensing device 21B, the shutter layer 44' is directly laminated on the semiconductor substrate 42. Here, for example, if a wiring layer, a color filter, or the like is arranged between the semiconductor substrate 42 and the shutter layer 44', the interval between the semiconductor substrate 42 and the shutter layer 44' is set to be less than or equal to a length $X_1$ of the shutter elements 33. Similarly, in the solid-state image sensing device 21B', if a wiring layer, a color filter, or the like is arranged between the semiconductor substrate 42 and the shutter layer 44", the interval between the semiconductor substrate 42 and the shutter layer 44" is set to be less than or equal to a length $X_2$ of the shutter elements 33.

Next, a fourth configuration example of the solid-state image sensing device 21 will be described with reference to FIGS. 9A and 9B. Note that the same constituents as those of the solid-state image sensing device 21 shown in FIG. 3 will be denoted by the same symbols and detailed descriptions thereof will be omitted.

FIG. 9A shows a solid-state image sensing device 21C as the fourth configuration example. As shown in FIG. 9A, the solid-state image sensing device 21C has the wiring layer 41, the semiconductor substrate 42, the shutter layer 44, a color filter 61, and the OCL layer 45 successively laminated to each other from its lower layer. In the solid-state image sensing device 21C, one shutter element 33 is arranged with respect to one PD 32 for each of the pixels 31.

That is, in the solid-state image sensing device 21C, the color filter 61 is arranged between the shutter layer 44 and the OCL layer 45. In the color filter 61, filters that cause corresponding colors of light to be transmitted therethrough are arranged for the respective pixels 31. In the example of FIG. 9A, the filter that causes green light to be transmitted therethrough is arranged in the pixel 31A, the filter that causes blue light to be transmitted therethrough is arranged in the pixel 31B, and the filter that causes red light to be transmitted therethrough is arranged in the pixel 31C.

FIG. 9B shows a solid-state image sensing device 21C' as a modification of the fourth configuration example. As shown in FIG. 9B, the solid-state image sensing device 21C' has the wiring layer 41, the semiconductor substrate 42, the color filter 61, the shutter layer 44, and the OCL layer 45 successively laminated to each other from its lower layer. In the solid-state image sensing device 21C', one shutter element 33 is arranged with respect to one PD 32 for each of the pixels 31. That is, in the solid-state image sensing device 21C', the color filter 61 is arranged between the semiconductor substrate 42 and the shutter layer 44.

As shown in FIGS. 9A and 9B, the color filter 61 may be arranged on either of the upper and lower sides of the shutter layer 44.

Next, a fifth configuration example of the solid-state image sensing device 21 will be described with reference to FIGS. 10A, 10B, 11A, and 11B. Note that the same constituents as those of the solid-state image sensing device 21 shown in FIG. 3 will be denoted by the same symbols and detailed descriptions thereof will be omitted.

FIG. 10A shows a solid-state image sensing device 21D as the fifth configuration example. As shown in FIG. 10A, the solid-state image sensing device 21D has the wiring layer 41, the semiconductor substrate 42, a shutter layer 44", the color filter 61, and the OCL layer 45 successively laminated to each other from its lower layer. Further, in the solid-state image sensing device 21D, the plurality of shutter elements 33 are arranged with respect to one PD 32 for each of the pixels 31.

That is, in the solid-state image sensing device 21D, five shutter elements $33A_1$ to $33A_5$ are arranged with respect to the PD 32A in the pixel 31A, and a filter that causes green light to be transmitted therethrough is arranged so as to correspond to the pixel 31A in the color filter 61. Further, five shutter elements $33B_1$ to $33B_5$ are arranged with respect to the PD 32B in the pixel 31B, and a filter that causes blue light to be transmitted therethrough is arranged so as to correspond to the pixel 31B in the color filter 61. Further, five shutter elements $33C_1$ to $33C_5$ are arranged with respect to the PD 32C in the pixel 31C, and a filter that causes red light to be transmitted therethrough is arranged so as to correspond to the pixel 31C in the color filter 61.

FIG. 10B shows a solid-state image sensing device 21D' as a modification of the fifth configuration example. The solid-state image sensing device 21D' is different from the solid-state image sensing device 21D only in that a plurality of colors of filters are arranged so as to correspond to one pixel 31 in the color filter 61'.

In the solid-state image sensing device 21D', the filters that cause green light, blue light, and red light to be transmitted therethrough are arranged so as to correspond to the pixel 31A in the color filter 61'. Note that the green filter and the blue filter are arranged with respect to two shutter elements 33 and that the red filter is arranged with respect to one shutter element 33. That is, in the color filter 61', the green filter is arranged with respect to the shutter elements $33A_1$ and $33A_2$, the blue filter is arranged with respect to the shutter elements $33A_3$ and $33A_4$, and the red filter is arranged with respect to the shutter element $33A_5$ so as to correspond to the pixel 31A.

Further, in the color filter 61', the red filter is arranged with respect to the shutter element $33B_1$, the green filter is arranged with respect to the shutter elements $33B_2$ and $33B_3$, and the blue filter is arranged with respect to the shutter elements $33B_4$ and $33B_5$ so as to correspond to the pixel 31B. Similarly, in the color filter 61', the red filter is arranged with respect to the shutter elements $33C_1$ and $33C_2$, the green filter is arranged with respect to the shutter elements $33C_3$ and $33C_4$, and the blue filter is arranged with respect to the shutter element $33C_5$ so as to correspond to the pixel 31C.

In the solid-state image sensing device 21D' where the plurality of colors of filters are arranged so as to correspond to one pixel 31 as described above, the colors of light to be incident on the PDs 32 may be selected for each of the pixels 31 as occasion demands. For example, when picking up an image with a composition where there is a blue sky over the grass, the solid-state image sensing device 21D' improves the resolution of the color of blue in an area corresponding to the blue sky and the resolution of the color of green in an area corresponding to the grass, thereby making it possible to pick up the clear image in detail. Accordingly, in this case, for the pixels 31 arranged in the area corresponding to the blue sky, the solid-state image sensing device 21D' controls the shutter elements 33 corresponding to the blue filters to be brought into the transmission state and the shutter elements 33 corresponding to the green filters and the red filters to be brought into the light shielding state. Similarly, for the pixels 31 arranged in the area corresponding to the grass, the solid-state image sensing device 21D' controls the shutter elements 33 corresponding to the green filter to be brought into the transmission state and the shutter elements 33 corresponding to the blue filters and the red filters to be brought into the light shielding state.

With such control, the solid-state image sensing device 21D' is allowed to improve the resolution of the colors and pick up fine images.

Figure 11A:
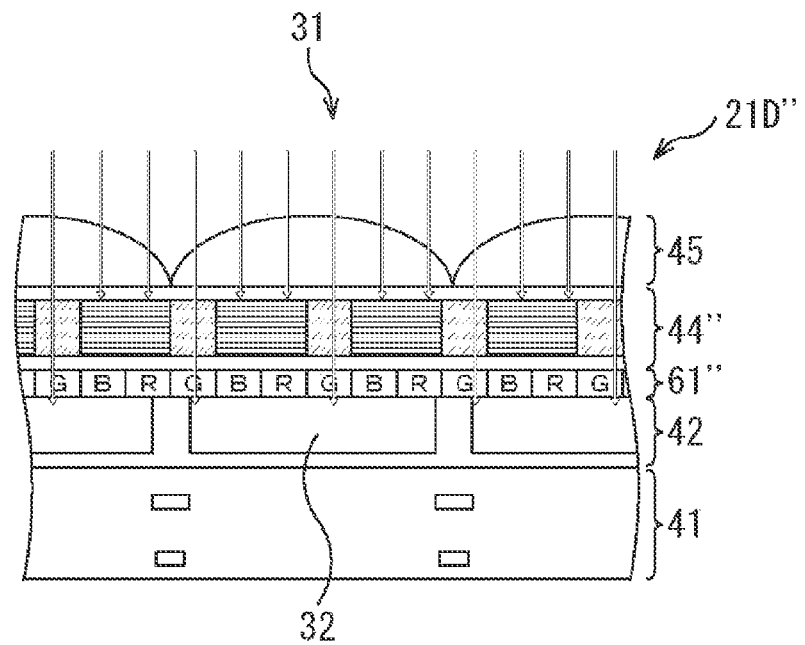
FIGS. 11A and 11B are views for explaining a state of the solid-state image sensing device where only green light is controlled to be transmitted.
Figure 11B:
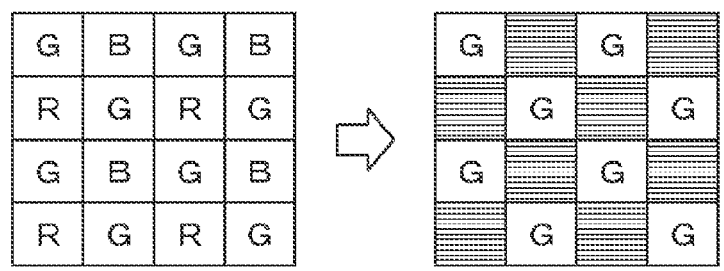

For example, FIGS. 11A and 11B show a state where only green light is controlled to be transmitted.

A solid-state image sensing device 21D" shown in FIG. 11A has the wiring layer 41, the semiconductor substrate 42, a color filter 61", the shutter layer 44", and the OCL layer 45 successively laminated to each other from its lower layer. Further, in the solid-state image sensing device 21D", a plurality of colors of filters are arranged with respect to one PD 32 in the color filter 61" for each of the pixels 31, and the shutter layer 44" is capable of controlling the transmission of incident light for each of the filters.

As shown in FIG. 11B, the color filter 61" has the colors of green, blue, and red arranged in so-called a Bayer pattern, and the shutter layer 44" controls the transmission of incident light for each of the colors. In the example of FIGS. 11A and 11B, the shutter elements 33 corresponding to the blue filters and the red filters are brought into the light shielding state, while the shutter elements 33 corresponding to the green filters are brought into the transmission state. Thus, green light is transmitted through the filters and received by the PDs 32. As a result, the solid-state image sensing device 21D" is allowed to improve the resolution of the color of green.

Note that in the solid-state image sensing device 21D" shown in FIG. 11A, the color filter 61" is sandwiched between the semiconductor substrate 42 and the shutter layer 44". However, the shutter layer 44" may be sandwiched between the semiconductor substrate 42 and the color filter 61".

Further, in the solid-state image sensing device 21, areas to be brought into the light shielding state in the shutter layer 44 may be controlled according to an incident angle of incident light with respect to the solid-state image sensing device 21.

Next, a sixth configuration example of the solid-state image sensing device 21 will be described with reference to FIGS. 12, 13A, and 13B. Note that the same constituents as those of the solid-state image sensing device 21 shown in FIG. 3 will be denoted by the same symbols and detailed descriptions thereof will be omitted.

Figure 12:
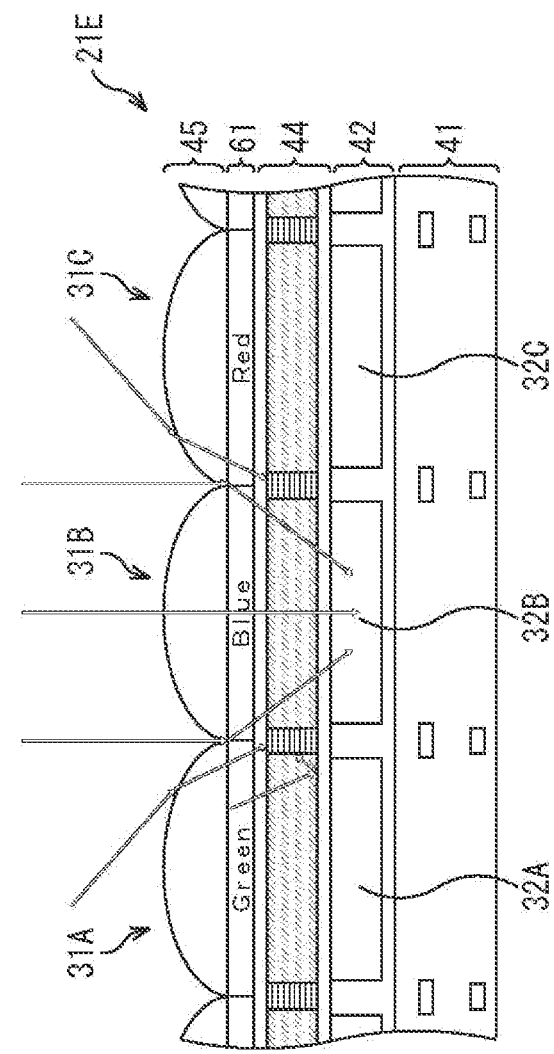
FIG. 12 is a cross-sectional view showing a sixth configuration example of the solid-state image sensing device.

A solid-state image sensing device 21E shown in FIG. 12 has the wiring layer 41, the semiconductor substrate 42, the shutter layer 44, the color filter 61, and the OCL layer 45 successively laminated to each other from its lower layer. In the color filter 61, filters that cause corresponding colors of light to be transmitted therethrough are arranged for the respective pixels 31. The shutter layer 44 is allowed to adjust areas to be brought into the light shielding state and the transmission state at a finer pitch than the pixels 31.

For example, when an optical system (such as an F-number and a lens) of an image sensing apparatus having the solid-state image sensing device 21E installed therein is changed, the angle of incident light to be incident on the solid-state image sensing device 21E is changed. At this time, in the solid-state image sensing device 21E, the shutter driving part 28 shown in FIG. 2 adjusts areas to be brought into the light shielding state in the shutter layer 44 according to the state of the optical system.

In other words, as shown in FIG. 12, the shutter driving part 28 adjusts the areas to be brought into the light shielding state in the shutter layer 44 so as to prevent the entering of the light transmitted through the OCL layer 45 of the adjacent pixels 31 and the color filter 61. Thus, the solid-state image sensing device 21E is allowed to prevent the degradation of image quality due to color mixture caused by the adjacent pixels 31 without reducing its sensitivity.

For example, the control circuit (e.g., control circuit 104 shown in FIG. 16 as will be described later) of the image sensing apparatus having the solid-state image sensing device 21E installed therein recognizes the type of an attached lens and lens information (optical properties and properties of the incident angle of light) such as an F-number (aperture state) when the lens is attached to the image sensing apparatus or when the aperture (F-number) of the lens is changed. Further, in the shutter driving part 28, a table is set in advance where information indicating optimum areas to be brought into the light shielding state in the shutter layer 44 is registered so as to be associated with each lens (incident angle of light). Further, the shutter driving part 28 communicates with the control circuit to recognize the present state of the optical system of the image sensing apparatus and adjusts areas to be brought into the light shielding state in the shutter layer 44 according to the incident angle of light.

Next, areas to be brought into the light shielding state according to the incident angle of light will be described with reference to FIGS. 13A and 13B.

FIG. 13A shows the solid-state image sensing device 21E where the incident angle of light is small, and FIG. 13B shows the solid-state image sensing device 21E where the incident angle of light is large. Note that in FIGS. 13A and 13B, the OCL layer 45 is not shown.

As shown in FIGS. 13A and 13B, light (color mixture component) incident from the adjacent pixels 31 is shielded in the shutter layer 44. Further, as the incident angle of light increases, areas to be brought into the light shielding state are shifted. Thus, the solid-state image sensing device 21E is allowed to more reliably shield the light incident from the adjacent pixels 31.

Moreover, in the solid-state image sensing device 21E, areas to be brought into the light shielding state in the shutter layer 44 are adjusted according to, for example, a lens. Thus, the solid-state image sensing device 21E is allowed to automatically perform pupil correction at each image height so as to correspond to the incident angle of light in the lens.

In the related art, pupil correction is performed by a light shielding film with a fixed layout. Therefore, when a lens is replaced, mismatching is caused in the pupil correction of the light shielding film and shading may occur in image quality. Further, when the lens specifications of an image sensing apparatus are changed, it is necessary to redesign a light shielding film to perform optimum pupil correction according to the specifications. Therefore, because a development operation and a reticle are increased, a manufacturing cost is increased. Moreover, a manufacturing yield is reduced due to the bonding of light shielding films and the processing irregularities of a line width.

On the other hand, because the solid-state image sensing device 21E is allowed to adjust pupil correction with the shutter layer 44, it is not necessary to perform the redesign of a light shielding film as described above. As a result, the solid-state image sensing device 21E is allowed to reduce a masking cost, increase the efficiency of a development operation, and reduce a manufacturing cost. Further, because optimum pupil correction is adjusted for each solid-state image sensing device 21E, it is possible to increase a throughput and a manufacturing yield without considering processing irregularities. This also results in a reduction in a manufacturing cost.

Next, a seventh configuration example of the solid-state image sensing device 21 will be described with reference to FIGS. 14A and 14B. Note that the same constituents as those of the solid-state image sensing device 21 shown in FIG. 3 will be denoted by the same symbols and detailed descriptions thereof will be omitted.

In a solid-state image sensing device 21G shown in FIGS. 14A and 14B, the shutter layer 44 is commonly driven with respect to the plurality of pixels 31. For example, in the solid-state image sensing device 21 shown in FIG. 3, the driving panel 52 of the shutter layer 44 is independently driven for each of the pixels 31. On the other hand, in the solid-state image sensing device 21G, the driving panel 52 of the shutter layer 44 is driven for the plurality of pixels 31, and the transmission of light is commonly controlled with respect to the plurality of pixels 31.

Alternatively, the solid-state image sensing device 21G may be uniformly driven by the whole driving panel 52 of the shutter layer 44. Thus, only with the control of a voltage to be applied to the driving panel 52, the optical transmittance of the whole screen may be collectively adjusted by the shutter layer 44. For example, FIG. 14A shows the solid-state image sensing device 21G where the whole shutter layer 44 is collectively brought into the transmission state, and FIG. 14B shows the solid-state image sensing device 21G where the whole shutter layer 44 is collectively brought into the light shielding state.

Further, the solid-state image sensing device 21 may be used for implementing the function of phase difference auto-focusing.

Next, the phase difference auto-focusing will be described with reference to FIGS. 15A to 15C.

Figure 15A:
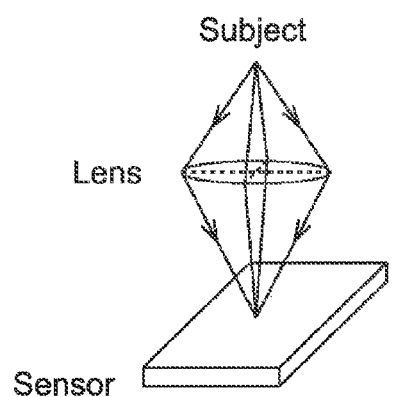
FIGS. 15A to 15C are views for explaining phase difference auto-focusing.

As shown in FIG. 15A, light from a subject is condensed by a lens onto the light receiving surface of a sensor (solid-state image sensing device).

Figure 15B:
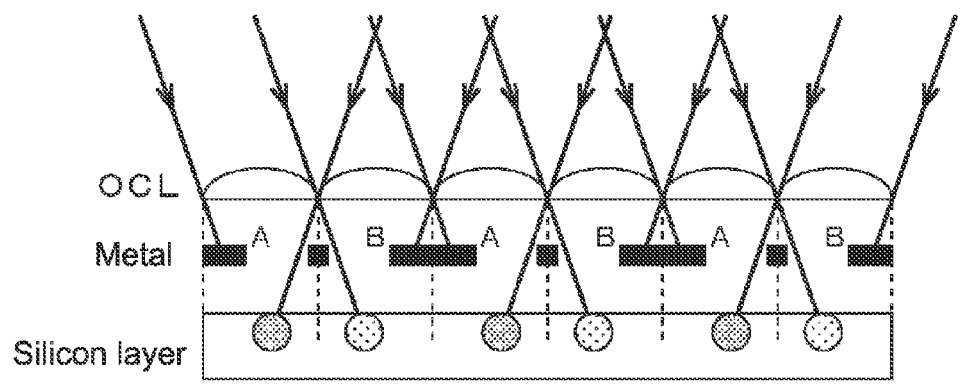

In the related art, as shown in FIG. 15B, in order to implement the function of the phase difference auto-focusing a solid-state image sensing device, a light shielding film made of metal that alternately shields the right side and the left side of each pixel from light is arranged on the side of the light receiving surface of a silicon layer having a light receiving part. Thus, light beams transmitted through the right sides of lenses and light beams transmitted through the left sides thereof are separately incident on the silicon layer. The focusing is adjusted based on the deviation between an image formed by the light beams transmitted through the right sides of the lenses and an image formed by the light beams transmitted through the left sides thereof.

Figure 15C:
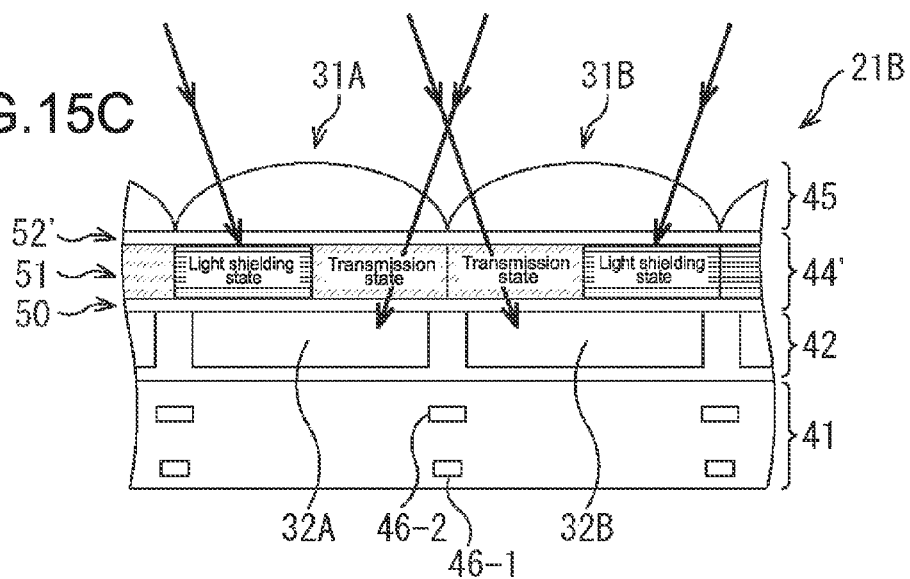

Further, as shown in FIG. 15C, with the use of the solid-state image sensing device 21B (FIG. 8B) where two shutter elements 33 are arranged with respect to one PD 32 for each of the pixels 31, it is made possible to cause light beams transmitted through the right sides of the lenses and light beams transmitted through the left sides thereof to be separately incident via the shutter layer 44" instead of the metal described above. Thus, the light beam transmitted through the right side of the lens is incident on the PD 32A, while the light beam transmitted through the left side thereof is incident on the PD 32B. In this manner, the solid-state image sensing device 21B is allowed to adjust the focusing based on the deviation between the images formed by such light beams.

Further, the solid-state image sensing device 21 of each of the configuration examples described above may be applied to various electronic apparatuses including image sensing systems such as digital still cameras and digital video cameras, mobile phones having image sensing functions, or other apparatuses having image sensing functions.

Figure 16:
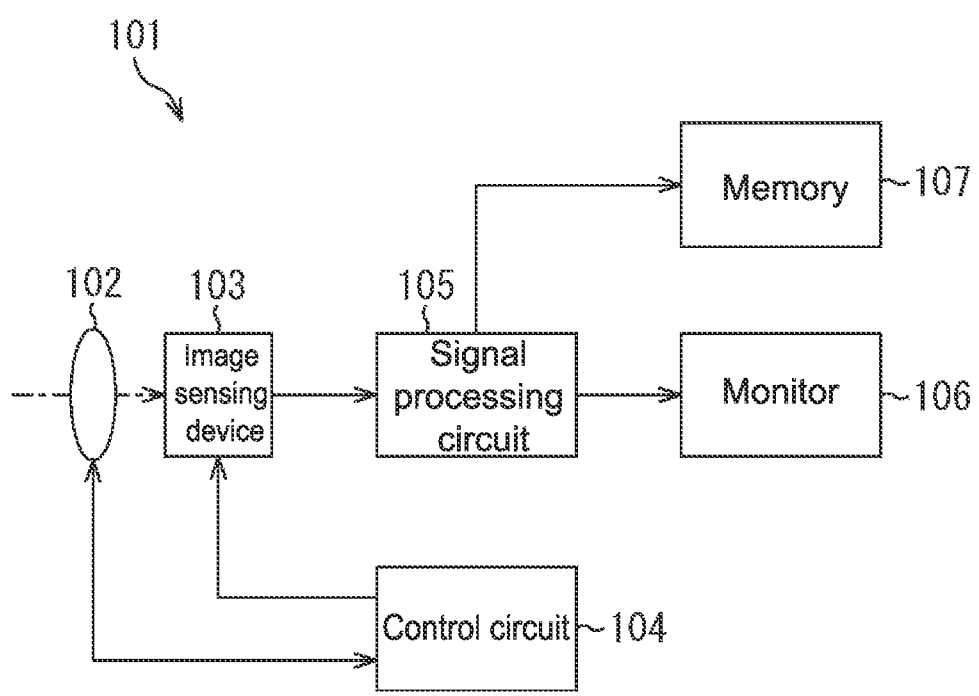
FIG. 16 is a block diagram showing a configuration example of an image sensing apparatus installed in an electronic apparatus.

FIG. 16 is a block diagram showing a configuration example of an image sensing apparatus installed in an electronic apparatus.

As shown in FIG. 16, the image sensing apparatus 101 has an optical system 102, an image sensing device 103, the control circuit 104, a signal processing circuit 105, a monitor 106, and a memory 107 and is capable of picking up still images and moving images.

The optical system 102 has one or a plurality of lenses, guides image light (incident light) from a subject into the image sensing device 103, and forms an image on the light receiving surface (sensor part) of the image sensing device 103.

As the image sensing device 103, the solid-state image sensing device 21 of any one of the configuration examples described above is applied. In the image sensing device 103, electrons are accumulated for a certain period of time according to an image formed on the light receiving surface via the optical system 102. Then, a signal according to the electrons accumulated in the image sensing device 103 is supplied to the signal processing circuit 105.

The control circuit 104 acquires information (optical properties, an F-number, or the like) on the lenses of the optical system 102 and supplies the acquired information to the image sensing device 103 (for example, the shutter driving part 28 of the solid-state image sensing device 21), thereby adjusting areas to be brought into the light shielding state in the shutter layer 44. Further, the control circuit 104 acquires from the image sensing device 103 information indicating the deviation between images as described with reference to FIGS. 15A to 15C and controls focusing with the optical system 102 according to the deviation.

The signal processing circuit 105 applies various signal processing to signal charges output from the image sensing device 103. An image (image data) obtained when the signal processing circuit 105 applies the signal processing to the signal charges is supplied to and displayed on the monitor 106 or supplied to and stored (recorded) in the memory 107.

With the application of the solid-state image sensing device 21 described above as the image sensing device 103, the image sensing apparatus 101 thus configured is allowed to further improve its image quality.

Further, the solid-state image sensing device 21 in the present disclosure may be applied to a CCD solid-state image sensing device besides a backside illumination type CMOS solid-state image sensing device. Further, the solid-state image sensing device 21 may also be applied to an image sensing device where photoelectric conversion parts are made of a material other than silicon. That is, the solid-state image sensing device 21 may be applied to any image sensing device so long as the image sensing device is capable of converting light into an electric signal.

Note that the present disclosure may also employ the following configurations.

(1) A solid-state image sensing device, including:

a light receiving layer having at least one photoelectric conversion part arranged in a plane state and configured to convert received light into an electric signal; and a shutter layer configured to control transmission of the light to be incident on the light receiving layer, in which an interval between the light receiving layer and the shutter layer is less than or equal to a length of at least one shutter element formed in the shutter layer.

(2) The solid-state image sensing device according to (1), further including:
a wiring layer having wiring connected to the light receiving layer, in which
the wiring layer is arranged on a surface on a side opposite to a surface of the light receiving layer where the light is irradiated.

(3) The solid-state image sensing device according to (1) or (2), in which
the shutter layer is configured to sandwich a liquid crystal layer with an electrode.

(4) The solid-state image sensing device according to any one of (1) to (3), in which
the at least one shutter element as a unit for controlling the transmission of the light in the shutter layer is arranged with respect to the at least one photoelectric conversion part in the light receiving layer.

(5) The solid-state image sensing device according to (4), in which
the at least one shutter element includes a plurality of shutter elements are arranged with respect to the at least one photoelectric conversion part in the light receiving layer.

(6) The solid-state image sensing device according to any one of (1) to (5), further including:
a color filter layer arranged on a surface of the light receiving layer where the light is irradiated, in which
the color filter layer has a filter arranged in a plane state and configured to cause a predetermined color of the light to be transmitted therethrough.

(7) The solid-state image sensing device according to (6), in which
the color filter layer has a plurality of colors of the filters arranged with respect to the at least one photoelectric conversion part in the light receiving layer.

(8) The solid-state image sensing device according to any one of (1) to (7), in which
the at least one photoelectric conversion part includes a plurality of photoelectric conversion parts, and the shutter layer is configured to commonly control the transmission of the light with respect to the plurality of photoelectric conversion parts in the light receiving layer.

(9) The solid-state image sensing device according to any one of (1) to (8), in which
the shutter layer is configured to adjust an area where the light is shielded according to an incident angle of the light with respect to the at least photoelectric conversion part.

The present disclosure contains subject matter related to that disclosed in Japanese Priority Patent Application JP 2011-184762 filed in the Japan Patent Office on Aug. 26, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image sensing device, comprising:
a light receiving layer having at least one photoelectric conversion part arranged in a plane state and configured to convert received light into an electric signal; and
a shutter layer configured to control transmission of the light to be incident on the light receiving layer, wherein
the shutter layer includes:
a driving panel having a plurality of electrodes;
a liquid crystal layer; and
a counter electrode, wherein the liquid crystal layer is sandwiched between the driving panel and the counter electrode, and wherein the counter electrode is on a side of the shutter layer facing the light receiving layer, wherein
an interval between the light receiving layer and the shutter layer is less than or equal to a length of at least one shutter element formed in the shutter layer.

2. The solid-state image sensing device according to claim 1, further comprising:
a wiring layer having wiring connected to the light receiving layer, wherein
the wiring layer is arranged on a surface on a side opposite to a surface of the light receiving layer where the light is irradiated.

3. The solid-state image sensing device according to claim 1, wherein
the shutter layer is configured to sandwich a liquid crystal layer with an electrode.

4. The solid-state image sensing device according to claim 1, wherein
the at least one shutter element as a unit for controlling the transmission of the light in the shutter layer is arranged with respect to the at least one photoelectric conversion part in the light receiving layer.

5. The solid-state image sensing device according to claim 4, wherein
the at least one shutter element includes a plurality of shutter elements, and the plurality of shutter elements are arranged with respect to the at least one photoelectric conversion part in the light receiving layer.

6. The solid-state image sensing device according to claim 1, further comprising:
a color filter layer arranged on a surface of the light receiving layer where the light is irradiated, wherein
the color filter layer has a filter arranged in a plane state and configured to cause a predetermined color of the light to be transmitted therethrough.

7. The solid-state image sensing device according to claim 1, wherein
the at least one photoelectric conversion part includes a plurality of photoelectric conversion parts, and the shutter layer is configured to commonly control the transmission of the light with respect to the plurality of photoelectric conversion parts in the light receiving layer.

8. The solid-state image sensing device according to claim 1, wherein
the shutter layer is configured to adjust an area where the light is shielded according to an incident angle of the light with respect to the at least one photoelectric conversion part.

9. A solid-state image sensing device, comprising:
a light receiving layer having at least one photoelectric conversion part arranged in a plane state and configured to convert received light into an electric signal; and
a shutter layer configured to control transmission of the light to be incident on the light receiving layer, wherein
an interval between the light receiving layer and the shutter layer is less than or equal to a length of at least one shutter element formed in the shutter layer;
a color filter layer arranged on a surface of the light receiving layer where the light is irradiated, wherein
the color filter layer has a filter arranged in a plane state and configured to cause a predetermined color of the light to be transmitted therethrough, wherein the color filter layer has a plurality of colors of the filters arranged with respect to each one of the photoelectric conversion part in the light receiving layer.

10. An electronic apparatus, comprising:

a solid-state image sensing device including
- a light receiving layer having at least one photoelectric conversion part arranged in a plane state and configured to convert received light into an electric signal, and
- a shutter layer configured to control transmission of the light to be incident on the light receiving layer, wherein the shutter layer includes:
- a driving panel having a plurality of electrodes;
- a liquid crystal layer; and
- a counter electrode, wherein the liquid crystal layer is sandwiched between the driving panel and the counter electrode, and wherein the counter electrode is on a side of the shutter layer facing the light receiving layer, wherein
- an interval between the light receiving layer and the shutter layer is less than or equal to a length of at least one shutter element formed in the shutter layer.

11. The electronic apparatus according to claim 10, further comprising:
- an optical system configured to condense the light onto a light receiving surface of the solid-state image sensing device; and
- a control part configured to control an area where the light is shielded in the shutter layer according to an optical property of the optical system.

* * * * *